(12) United States Patent
Maurer et al.

(10) Patent No.: US 11,616,032 B2
(45) Date of Patent: Mar. 28, 2023

(54) SEMICONDUCTOR DEVICE HAVING ALIGNMENT PADS AND METHOD OF MANUFACTURING THE SAME

(71) Applicant: Infineon Technologies AG, Neubiberg (DE)

(72) Inventors: Daniel Maurer, Feld am See (AT); Christof Altstaetter, Gaimberg (AT); Thomas Beyreder, Villach (AT); Oliver Blank, Villach (AT); Jürgen Bostjancic, Ludmannsdorf (AT); Andreas Kleinbichler, Villach (AT); Josef Liegl, Kappel am Krappfeld (AT); Nicole Schulze-Ollmert, Villach (AT)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 17/152,988

(22) Filed: Jan. 20, 2021

(65) Prior Publication Data
US 2021/0242148 A1 Aug. 5, 2021

(30) Foreign Application Priority Data

Jan. 30, 2020 (DE) .......................... 102020102282.4

(51) Int. Cl.
*H01L 23/00* (2006.01)
*G01R 31/28* (2006.01)

(52) U.S. Cl.
CPC .......... *H01L 24/05* (2013.01); *G01R 31/2891* (2013.01); *H01L 24/03* (2013.01); *H01L 2224/0217* (2013.01); *H01L 2224/03015* (2013.01); *H01L 2224/05166* (2013.01); *H01L 2224/05184* (2013.01); *H01L 2224/05193* (2013.01)

(58) Field of Classification Search
CPC ............ H01L 24/05; H01L 2224/0217; H01L 2224/03015; H01L 2223/54426; H01L 23/544
See application file for complete search history.

(56) References Cited

U.S. PATENT DOCUMENTS

| | | | | |
|---|---|---|---|---|
| 5,888,884 A * | 3/1999 | Wojnarowski | ...... | H01L 25/0652 257/E21.597 |
| 6,468,136 B1 * | 10/2002 | Lum | ...... | B24B 37/24 438/692 |
| 9,146,273 B2 | 9/2015 | Pagani | | |
| 2010/0244235 A1 * | 9/2010 | Kapusta | ...... | H01L 21/561 438/118 |
| 2011/0156732 A1 * | 6/2011 | Pagani | ...... | G01R 31/2891 324/750.16 |

(Continued)

FOREIGN PATENT DOCUMENTS

WO WO-2017066077 A1 * 4/2017 ............. B24B 37/22

*Primary Examiner* — Mamadou L Diallo
(74) *Attorney, Agent, or Firm* — Murphy, Bilak & Homiller, PLLC

(57) ABSTRACT

A semiconductor device includes a semiconductor substrate having a main surface over which a plurality of die pads and at least one alignment pad for optical process control for semiconductor wafer probing are arranged. The alignment pad has a hardness smaller than a hardness of the plurality of die pads.

28 Claims, 7 Drawing Sheets

(56) References Cited

U.S. PATENT DOCUMENTS

| | | | |
|---|---|---|---|
| 2011/0279137 A1* | 11/2011 | Pagani | G01R 3/00 |
| | | | 324/754.03 |
| 2013/0241058 A1* | 9/2013 | Yu | H01L 24/05 |
| | | | 257/E23.021 |
| 2015/0287656 A1* | 10/2015 | Killingsworth | H01L 22/32 |
| | | | 438/15 |
| 2017/0365569 A1* | 12/2017 | Kriebel | H01L 24/92 |
| 2018/0277511 A1* | 9/2018 | Yagyu | H01L 24/85 |
| 2018/0358300 A1* | 12/2018 | Keizer | G06T 7/70 |
| 2018/0374795 A1* | 12/2018 | Deguchi | H01L 21/3205 |

\* cited by examiner

SEMICONDUCTOR DEVICE HAVING ALIGNMENT PADS AND METHOD OF MANUFACTURING THE SAME

TECHNICAL FIELD

This disclosure relates generally to the field of semiconductor devices and semiconductor device probing, and in particular to the field of manufacturing semiconductor devices having alignment pads for wafer probing.

BACKGROUND

The final stages of wafer manufacturing include several tests to be carried out before the wafer is separated into dies (chips). Some of these tests are performed in a so-called wafer prober. During wafer probing, probing needles are touched down and press-contacted to the die pads on the wafer to electrically connect to the die pads and the integrated circuits (ICs) formed in the wafer. To ensure proper alignment of the die pads and the probing needles, the imprints of the probing needles on the die pads are observed by optical inspection and the positions of the imprints are evaluated for alignment.

If the pad metallization is too hard, the imprint is not or only hardly visible. In this case, the position of the needle touch down on the die pad cannot be measured or can only be measured with insufficient confidence.

SUMMARY

According to an aspect of the disclosure, a semiconductor device includes a semiconductor substrate comprising a main surface over which a plurality of die pads and at least one alignment pad for optical process control for semiconductor wafer probing are arranged. The alignment pad has a hardness smaller than a hardness of the plurality of die pads.

According to another aspect of the disclosure, a method of manufacturing a semiconductor device comprises forming a plurality of die pads over a main surface of a semiconductor wafer. The method further comprises forming at least one alignment pad for optical process control for semiconductor wafer probing on the main surface of the semiconductor wafer. The alignment pad has a hardness smaller than a hardness of the plurality of die pads.

According to still another aspect of the disclosure, a method of performing optical process control for semiconductor wafer probing comprises press-contacting probing needles on a plurality of die pads and at least one alignment pad arranged over a main surface of a semiconductor wafer. The at least one alignment pad has a hardness smaller than a hardness of the plurality of die pads. The method further comprises determining the position of a needle imprint on the at least one alignment pad by optical inspection.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

It is to be understood that the features of the various exemplary embodiments and examples described herein may be combined with each other, unless specifically noted otherwise.

As used in this specification, the terms "deposited", "covered", or "applied" or similar terms are not meant to mean that the elements or layers must directly be contacted together; intervening elements or layers may be provided between the "deposited", "covered", or "applied" elements, respectively. However, in accordance with the disclosure, the above-mentioned and similar terms may, optionally, also have the specific meaning that the elements or layers are directly contacted together, i.e. that no intervening elements or layers are provided between the "deposited", "covered", or "applied" elements, respectively.

Further, the words "over" or "beneath" with regard to a part, element or material layer formed or located or arranged "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located or arranged "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1A:
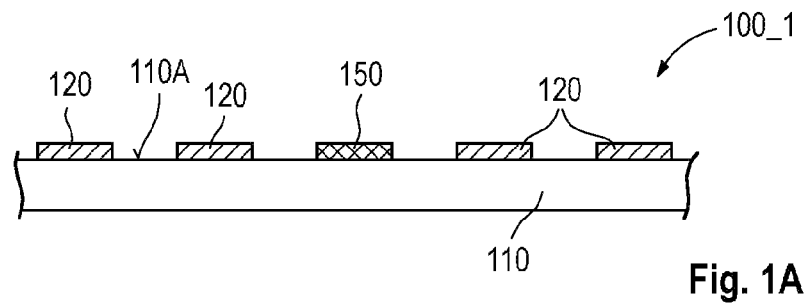
FIG. 1A is a schematic cross-sectional illustration of an exemplary semiconductor device.

Referring to FIG. 1A, a semiconductor device 100_1 may include a semiconductor substrate 110 and a plurality of die pads 120 arranged over a main surface 110A of the semiconductor substrate 110. Further, an alignment pad 150 is arranged over the main surface 110A of the semiconductor substrate 110. The alignment pad 150 has a hardness smaller than a hardness of the plurality of the die pads 120. The main surface 110A of the semiconductor substrate 110 may, e.g., comprise or be of a semiconductor material, in particular monocrystalline silicon (e.g. epitaxial silicon), polycrystalline silicon, or amorphous silicon.

The semiconductor substrate 110 has been processed before so that integrated circuits (ICs) are provided in or on the semiconductor substrate 110. The ICs (not shown) may be transistors, diodes, etc. The ICs may be monolithically integrated in the semiconductor substrate 110. Each of the ICs may be electrically connected to multiple die pads 120. That is, the die pads 120 may serve for input/output (I/O) connectivity, power supply connectivity, etc., for the ICs.

The semiconductor substrate 110 may be a wafer, e.g. a wafer which has already been processed in the front end of a semiconductor manufacturing line. According to another possibility, the semiconductor substrate 110 may be a chip, i.e. a semiconductor die which has been cut out of a semiconductor wafer.

The ICs (not shown) may, e.g., represent power ICs, logic ICs, optical ICs, MEMS (micro-electro-mechanical systems) ICs, etc.

As will be explained in more detail below, the die pads 120 are made of an electrically conductive material which is relatively hard. By way of example, the die pads 120 may include a layer of tungsten or tungsten alloy or titanium or titanium alloy or polysilicon.

On the other hand, the alignment pad 150 is made of a material which is softer than the material of the die pads 120. As will be explained in more detail below, the inclusion of "soft" alignment pads 150 allow for improved process control during semiconductor wafer probing.

More specifically, the alignment pad 150 is configured to generate a visible imprint upon being press-contacted by a probing needle at semiconductor wafer probing. This visible imprint allows to detect and to control the position of the semiconductor wafer relative to a probe card at which the probing needle(s) is (are) attached. On the other hand, the die pads 120 may be as hard so as to not generate a visible imprint—or only a hardly visible imprint—upon being press-contacted by a probing needle at semiconductor wafer probing.

In other words, the "regular" die pads 120 may not be used for performing optical process control for semiconductor wafer probing, since they do not generate an imprint upon being press-contacted by a probing needle which is sufficiently visible for reliably determining the position of the needle on the die pad 120 by optical inspection. More specifically, touchdown tests with a probe card comprising tungsten probing needles pressed on a tungsten die pad 120 having a die pad thickness of 200 nm revealed indentation depths ranging from about 17 nm (at 50 µm overdrive) to about 22 nm (at 100 µm overdrive). Such imprints are only visible with high magnification scanning electron microscopy (SEM) or with atomic force microscopy (AFM), but not by optical inspection.

To overcome this shortcoming, the softer alignment pad(s) 150 is (are) added on the main surface 110A of the substrate 110 so as to allow the formation of needle imprints on the substrate 110 which could be used to determine and, where appropriate, to adjust the position of the semiconductor substrate 110 relative to the probe card.

In FIG. 1A, the alignment pad 150 comprises a material which has been specifically deposited on the substrate 110 for the generation of an imprint layer of the alignment pad 150.

The alignment pads 150 may not have any electrical functionality. That is, even if the alignment pad 150 comprises an electrically conductive material, the alignment pad 150 may not be electrically connected to any IC implemented in the semiconductor substrate 110.

Figure 1B:
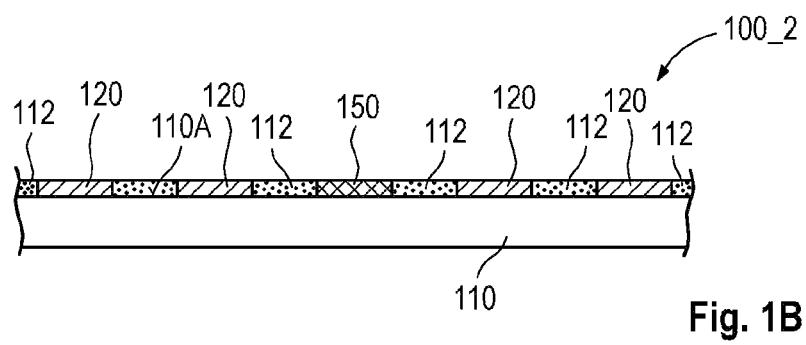
FIG. 1B is a schematic cross-sectional illustration of an exemplary semiconductor device.

FIG. 1B illustrates an exemplary semiconductor device 100_2. Semiconductor device 100_2 is similar to semiconductor device 100_1 except that the alignment pad 150 in semiconductor device 100_2 includes an imprint layer which is formed as a portion of a pre-existing substrate layer 112 covering the main surface 110A of the substrate 110. By way of example, the pre-existing substrate layer 112 may be a bulk semiconductor layer such as, e.g., a monocrystalline, polycrystalline or amorphous semiconductor layer. The pre-existing substrate layer 112 may, in other examples, be a pre-existing lithography layer and/or a hard passivation layer such as, e.g., a layer made of a material based on silicon oxide or silicon nitride or a combination thereof. The alignment pad 150 may be formed out of the pre-existing substrate layer 112 by locally processing the pre-existing substrate layer 112 to obtain the desired (e.g. reduced) hardness of the alignment pad 150.

Other features and characteristics of the semiconductor substrate 100_2 may be identical to the features and characteristics as described above for semiconductor device 100_1, and reference is made to the above description to avoid reiteration.

In semiconductor device 100_1 and in semiconductor device 100_2, the smaller hardness of the alignment pad 150 as compared to the die pads 120 may be achieved in various different ways. According to one possibility, the alignment pad 150 includes an imprint layer of a material having an intrinsically smaller hardness than the hardness of the material of the die pads 120. That is, the imprint layer of the alignment pad 150 may simply be made of an intrinsically softer material than the pad material of the die pads 120. By way of example, the imprint layer of the alignment pad 150 may comprise or be of a soft metal material (such as AlCu) or of a polymer material.

According to another possibility, a functional imprint layer of an alignment pad 150 may also be made of a "hard" material which is softened by structuring. Generating a structure of a sufficiently small structural width in the imprint layer reduces the hardness of the imprint layer by rendering the imprint layer fragile. This causes the (structured) imprint layer to generate visible imprints upon being press-contacted by a probing needle. Structuring of the imprint layer may be performed in many ways, e.g., by lithography or other micro-structuring techniques or by specifically generating the imprint layer to provide for a porous structure.

The aforementioned concepts and further approaches will be explained in more detail by way of examples described in conjunction with FIGS. 7 to 15.

Figure 2:
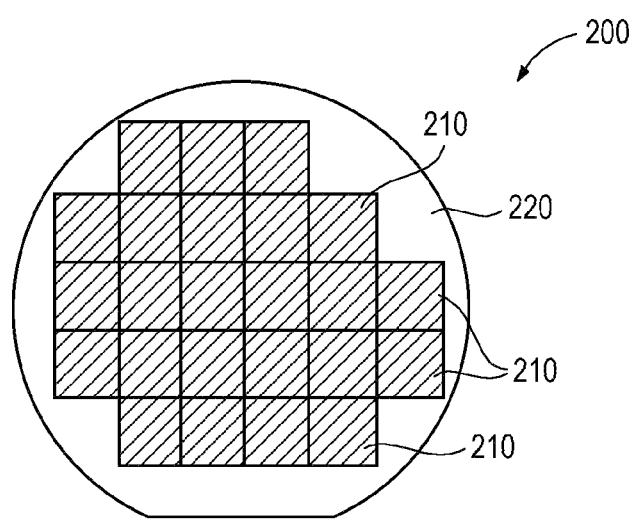
FIG. 2 is a schematic top view of an exemplary semiconductor wafer.

FIG. 2 illustrates an exemplary semiconductor wafer 200. As already mentioned, the semiconductor substrate 110 may be or form a part of the semiconductor wafer 200. The semiconductor wafer 200 may be made of any semiconductor material, e.g. Si, SiC, SiGe, GaAs, GaN, AlGaN, InGaAs, InAlAs, etc.

Figure 3:
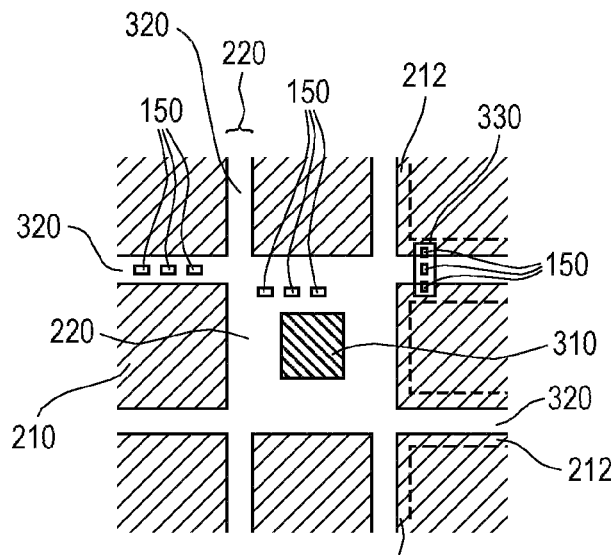
FIG. 3 is an enlarged top view on the exemplary semiconductor wafer of FIG. 2.

A plurality of ICs 210 (semiconductor chips) is formed on the semiconductor wafer 200 in, e.g., a grid-like fashion. Further, the semiconductor wafer 200 includes non-chip regions 220. Non-chip regions 220 are usually located on an outer peripheral part of the semiconductor wafer 200 (see FIG. 2). However, as depicted in FIG. 3, non-chip regions 220 may also be formed by kerf regions 320 (i.e. dicing streets) and/or may be provided around dummy chips 310. For instance, dummy chips 310 are test chips which are used during wafer test.

As shown in FIG. 3, the alignment pads 150 may be located in such non-chip regions 220. Further, alignment pads 150 may be located in process-control monitor (PCM) block regions 330. PCM blocks are equipped with resistors, inductors, capacitors and transistors of different sizes and are distributed at many locations across the semiconductor wafer 200. PCM blocks allow to check the quality of the fabrication process over the whole semiconductor wafer 200.

Further, it is to be noted that the PCM block regions 330 may intersect or overlap with a peripheral region 212 of the ICs 210. That is, in the case that the alignment pads 150 are located in a PCM block region 330, and possibly also in other cases, the alignment pads 150 or a part thereof may still be present at some of the ICs 210, i.e. at some of the semiconductor chips diced out of the semiconductor wafer 200.

Figure 4A:
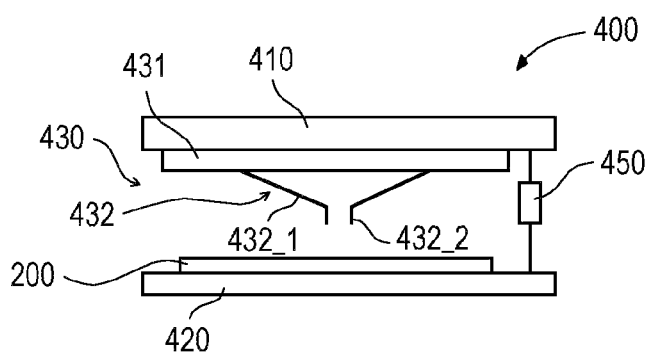
FIGS. 4A-4B are schematic cross-sectional views illustrating an exemplary wafer test equipment for wafer probing before and after touch down of a probe card on a wafer.

FIG. 4A illustrates a cross-sectional view of an exemplary wafer test equipment 400 for semiconductor wafer probing. The wafer test equipment 400 may include a holder 410, a wafer support (chuck) 420 and a manipulator 450 configured to vary the distance between the holder 410 and the wafer support 420. A probe card 430 may be attached to the holder 410. The probe card 430 may include a probing needle carrier 431 and a plurality of probing needles 432 fixed at the probing needle carrier 431. The probing needles 432 may be of a cantilever type having a cantilever section 432_1 and a tip section 432_2.

Figure 4B:
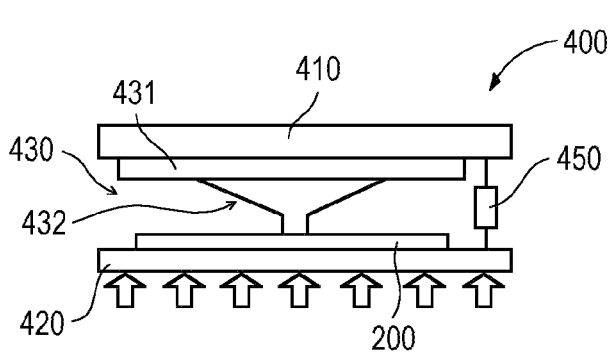

During wafer probing a wafer 200 is placed on the wafer support 420. Then, as shown in FIG. 4B, the wafer test equipment 400 performs a touch-down of the probe card 430 on the wafer 200. During touch-down the tips at the tip sections 432_2 of the probing needles 432 are press-contacted onto the die pads. The touch-down may be accomplished by the manipulator 450. The overdrive (i.e. the displacement from initial probing needle on die pad contact to the setting position of the wafer test equipment 400) can be precisely measured and controlled. The overdrive corresponds to the force exerted by the tip of the probing needle 432 on the die pad.

Since the locations of the die pads are variable, depending on the type of the semiconductor device to be fabricated, it is necessary to use different probe cards 430 for different types of ICs 210 or different types of semiconductor wafers 200 to be tested. Further, it may be necessary to change probe cards 430 each time a different type of ICs 210 or semiconductor wafer 200 is going to be tested.

When a probe card 430 is newly introduced into the wafer test equipment 400 for probing ICs 210 on a corresponding semiconductor wafer 200, the probe card 430 may need to be aligned so that a correct positional relationship is established between the probing needles 432 (or, more specifically, the tips thereof) and the die pads on the semiconductor wafer 200. This alignment needs to be made to guarantee that the tips of the probing needles 432 are press-contacted exactly on the die pads during wafer probing.

Conventionally, such alignment of the probing needles 432 (or of the probe card 430 when being attached to the holder 410) is done by determining the imprints of the tips of the probing needles 432 on the die pads. The determination of the position of the imprints on the die pads is done by optical inspection. To this end, after the touch-down of the probe card 430 on the semiconductor wafer 200 has been performed as shown in FIG. 4B, the semiconductor wafer 200 with the imprints on the die pads is subjected to an optical inspection for recognizing the imprints and for determining the locations of imprints the on the die pads.

Figure 5:
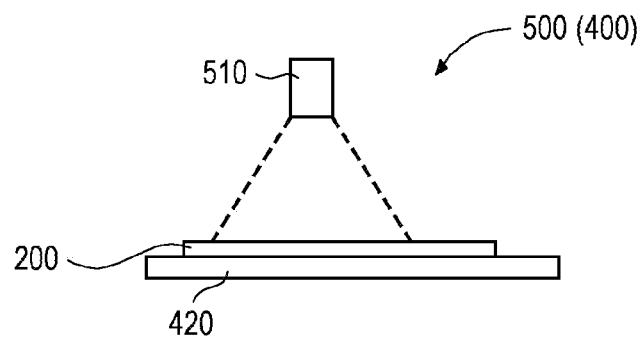
FIG. 5 is a schematic cross-sectional illustration of an exemplary optical inspection control unit of the wafer test equipment of FIGS. 4A-4B.

As shown in FIG. 5, the optical inspection may be performed in an optical inspection unit 500 which may, e.g., be integrated in the wafer test equipment 400. The optical inspection unit 500 may comprise a camera 510 configured to capture an image (or a partial image) of the semiconductor wafer 200 (or, referring to FIGS. 1A-1B, of the main surface 110A of the semiconductor substrate 110). The optical inspection unit 500 may further include an imprint recognition and position calculating unit (not shown) which receives the image data and is configured to perform digital image processing for detecting the imprints on the die pads and for determining their respective positions. The optical inspection unit 500 may be configured to detect imprints on die pads which are visible without SEM and/or AFM, e.g. imprints which may have an indentation depth of equal to or greater than 50 nm.

Further, the wafer test equipment 400 may be provided with a controller (not shown) configured to align the semiconductor wafer 200 in accordance with the detected and calculated positions of the imprints on the die pads. That is, if the imprints have a certain lateral offset from the centers of the die pads, the position of the probe card 430 at the holder 410 relative to the semiconductor wafer 200 and/or the position of the semiconductor wafer 200 on the wafer support 420 is adjusted so as to correctly align the probing needles 432 with the die pads on the semiconductor wafer 200.

This approach sensibly relies on the capability of the die pads to generate (sufficiently) visible imprints upon being press-contacted by the probing needles 432. Conventionally used AlCu die pads, for instance, are known to generate such visible imprints. However, if the die pads are made of a material having a somewhat higher hardness (or if the probing needles 432 are made of a softer material and/or are operated with smaller overdrive), the imprints on the regular die pads may not be sufficiently visible (or visible at all) in order to ensure reliable operation (or operation at all) of the optical inspection unit 500. It is to be noted that the probing needle 432 may be made of the same (hard) material as the die pads 120. For instance, if the probing needle 432 is made of tungsten, a die pad 120 made of tungsten does not provide for a probing needle imprint of sufficient visibility.

According to the disclosure, the alignment pad(s) 150 having a hardness smaller than the hardness of the plurality of die pads 120 (see FIGS. 1-3) are used for optical process control during semiconductor wafer probing. The alignment pads 150 are configured to generate a visible imprint upon being press-contacted by a probing needle 432. This may overcome the above-described challenges during conventional semiconductor wafer probing when the die pads 120 do not provide for a visible imprint or do only generate a hardly visible imprint of a quality which may not be sufficient for reliably detecting the imprint and/or determining the position of the imprint by optical inspection.

Press-contacting of the alignment pad(s) 150 may be performed in the wafer test equipment 400 in the same way as described above for conventional operation. Further, the recognition of the imprint(s) on the alignment pad(s) 150 on the semiconductor wafer 200 may be performed in the optical inspection unit 500 the same way as described above with reference to the conventional operation. Further, the subsequent steps of image processing (e.g. optical recognition and calculation of the positions of the imprints on the alignment pads 150) and the pre-alignment of the semiconductor wafer 200 and/or the probe card 430 relative to each other by using a controller may be performed the same way as described above. Therefore, in order to avoid reiteration and for the sake of brevity, reference is made to the above description (referring to the imprints on die pads 120) in view of the imprint(s) produced on the alignment pad(s) 150.

Figure 6:
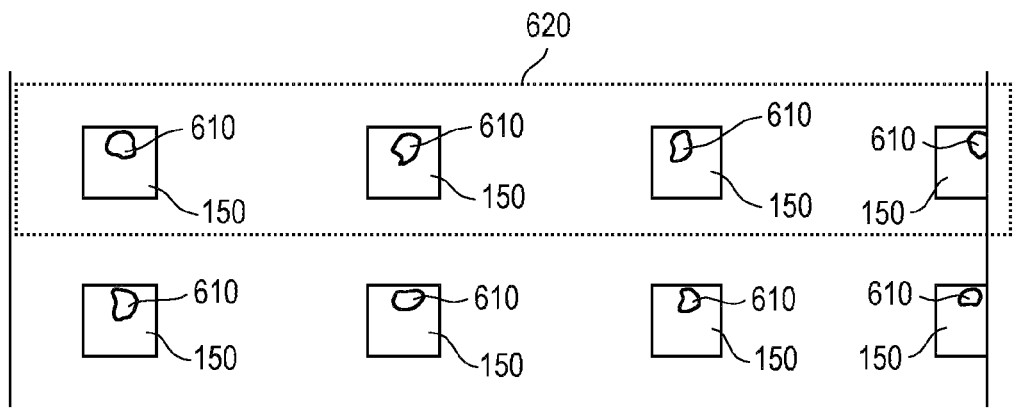
FIG. 6 is an illustration showing visible imprints on alignment pads as observable by optical inspection.

FIG. 6 illustrates visible imprints 610 as produced by probing needles 432 press-contacted on alignment pads 150. As apparent from FIG. 6, the imprints 610 are off-centered by a certain distance. This off-center distance can be determined and the pre-alignment of the position of the semiconductor wafer 200 relative to the position of the probe card 430 can be adjusted in accordance with the measured off-center distance. Statistics can be improved by evaluating image data from a plurality of alignment pads 150, e.g. a row 620 of 4 alignment pads 150 as exemplified in FIG. 6.

The disclosure encompasses a variety of different possibilities to provide for alignment pads 150 having a hardness smaller than a hardness of the plurality of die pads 120. Throughout the description, the wording of a "structured imprint layer" is used for an imprint layer of an alignment pad which is provided with an internal structure which causes the hardness of the alignment pad to be reduced so as to cause the alignment pad to produce a (more) clearly visible imprint upon being press-contacted by a probing needle 432. The wording "contour-shaped imprint layer", on the other hand, is used herein to mean a structuring process of the imprint layer of an alignment pad 150 which exclusively relates to the outline (i.e. the outer shape) of the imprint layer. The wording "continuous imprint layer" of an alignment pad 150 means that the respective imprint layer continuously covers at least an inner region of the alignment pad 150 but may or may not be structured (in terms of layer thickness) or contour-shaped (in terms of lateral outline-structuring).

Figure 7:
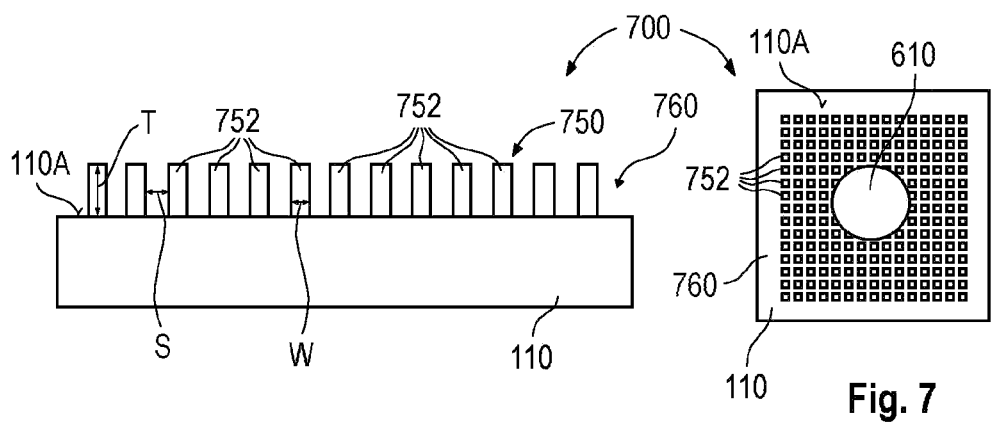
FIG. 7 is a schematic cross-sectional view and a schematic top view of an exemplary alignment pad including a structured imprint layer.

The hardness of a material can be effectively lowered by lithographic structuring a hard material into microscopic structures. FIG. 7, inter alia, illustrates an example of an alignment pad 700 (sectional view and top view) which is based on this approach. The alignment pad 700 comprises or consists of a structured imprint layer 750. The structured imprint layer 750 may comprise a regular patterned structure such as, e.g., a pillar pattern (see top view on the right side of FIG. 7). Pillars 752 may, e.g., have a rectangular or square shape. It has been found that square or rectangular shaped pillars 752 are easy to break upon being press-contacted by a needle tip. Further, they do not show to produce a center-edge-effect, i.e. a broadening of the imprint due to the transmission of shear forces by "lateral squeezing". Differently put, the shape of the imprint 610 precisely reflects the zone where the structured imprint layer 750 is hit by the tip of the probing needle.

As illustrated in FIG. 7, the structured imprint layer 750 may be contour-shaped. Contour-shaping allows to define a frame-like region 760 of the alignment pad 700 which may assist in finding or detecting the alignment pad 700 during optical inspection and may further facilitate image data processing, e.g. analyzing the image data and retrieving the exact center location of the imprint 610 on the alignment pad 700.

The generated frame-like region 760 surrounds the structured imprint layer 750. Depending on the optical contrast between the material of this frame-like region (here: e.g. the material at the main surface 110A of the semiconductor substrate 110) and the top surface of the structured imprint layer 750, the alignment pad 700 with the frame-like region can easily be detected by optical inspection.

It is to be noted that alternatively to a regular patterned structure (which may be generated by lithography), the structured imprint layer 750 may also be formed of a porous structure. Porosity can similarly be effective to lower the hardness of a material so as to be capable of generating visible imprints 610 upon being press-contacted by a probing needle.

The structured imprint layer 750 may be made of various materials. For instance, the structured imprint layer 750 may comprise or be of an inorganic insulating material, in particular a material based on silicon oxide or silicon nitride. For instance, a pre-existing lithography layer such as, e.g., a hard passivation layer covering the entire semiconductor wafer may be locally structured and (optionally) contour-shaped to form the alignment pad 700. That is, in this case the pre-fabricated hard passivation layer can be used as the structured imprint layer 750 simply by performing lithographic structuring and (optionally) contour-shaping of the hard passivation layer.

The alignment pad 700 may be generated without requiring any additional semiconductor processing step compared to conventional processing. Rather, the lithography step for opening the hard passivation layer (or any other pre-existing layer) at the die pads of the ICs may be modified to also structure the hard passivation layer (or any other pre-existing layer) so as to generate the structured (and optionally contour-shaped) imprint layers 750 of the alignment pads 700 from the conventional hard passivation layer (or from any other pre-existing lithography layer). That way, generating the alignment pads may be fully implementable in existing lithography steps.

In this case, the alignment pads 700 may be considered to represent a "second use" of an already existing hard passivation layer or any other pre-existing layer (e.g. the pre-existing substrate layer 112 of FIG. 1B).

The structured imprint layer 750 may comprise or be of a semiconductor material, in particular monocrystalline silicon (e.g. epitaxial silicon), polycrystalline silicon, or amorphous silicon. By way of example, the structured imprint layer 750 may also be formed in the bulk material of the semiconductor substrate 110.

If the structured imprint layer 750 is made of a non-metal material and is positioned in the kerf region, a metal free kerf can be provided which is effective in improving the dicing quality of the semiconductor wafer.

According to another example, the structured imprint layer 750 may comprise or be of an electrically conductive material, e.g. of a first metal material. This first metal material may, e.g., be the same "hard" metal material as used for the die pads of the ICs. However, its hardness is reduced and its capability of generating visible imprints is increased by the structuring approach.

The structure width W of the structured imprint layer may be equal to or greater than or less than 0.1 μm, 0.25 μm, 0.5 μm, 0.75 μm, 1.0 μm, 2.5 μm or 5.0 μm. The free distance S between the structural elements (e.g. pillars 752) may lie within the same ranges.

Figure 8:
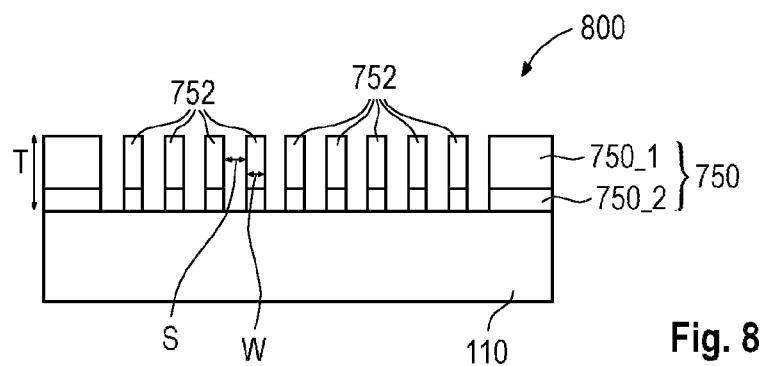
FIG. 8 is a schematic cross-sectional view of an exemplary layer stack of a structured imprint layer of an exemplary alignment pad.

FIG. 8 illustrates an alignment pad 800. Alignment pad 800 is a variant of alignment pad 700. All features explained in the following in the context of alignment pad 800 may be separately or in combination applied to alignment pad 700.

FIG. 8 illustrates an exemplary layer stack of an structured imprint layer, e.g. the structured imprint layer 750 of FIG. 7. In this example, the structured imprint layer 750 comprises a lower structured layer 750_2 of $SiO_x$ and an upper structured imprint layer 750_1 of BPSG (borophosphosilicate glass).

The hardness of BPSG is about a factor of 10 to 12 higher than the hardness of AlCu. Almost no needle imprint can be seen on an unstructured BPSG layer. The same problem of excessive hardness and insufficient visibility of imprints is encountered, e.g., for tungsten, titanium or polycrystalline silicon die pads.

In the specific example shown in FIG. 8, the thickness of the lower structured imprint layer 752_2 is 250 nm and the thickness of the upper structured imprint layer 750_1 is 700 nm. The structure width W is 500 nm and the free distance S between adjacent pillars 752 is also 500 nm. Further, it is to be noted that in FIG. 8 the structured imprint layer 750 is, e.g., not contour-shaped (in contrast to the variant shown in FIG. 7).

Generally, the thickness of the structured imprint layer 750 (which corresponds to the height of the pillars 752) may, e.g., be equal to or greater than the structure width W. In particular, the thickness T of the structured imprint layer 750 may be equal to or greater than or less than 0.5 μm, 1.0 μm, 1.5 μm, 2.0 μm, 3.5 μm or 5.0 μm.

In view of further features of the alignment pad 800, reference is made to the description of the alignment pad 700 to avoid reiteration.

Figure 9A:
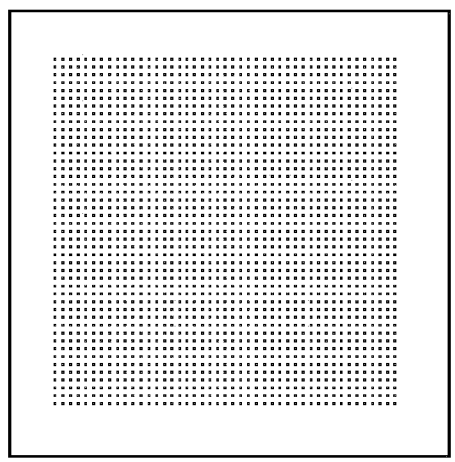
FIGS. 9A-9B are contour-traced scanning electron microscope images of a structured imprint layer before and after being press-contacted by a probing needle.
Figure 9B:
Figure 9B:
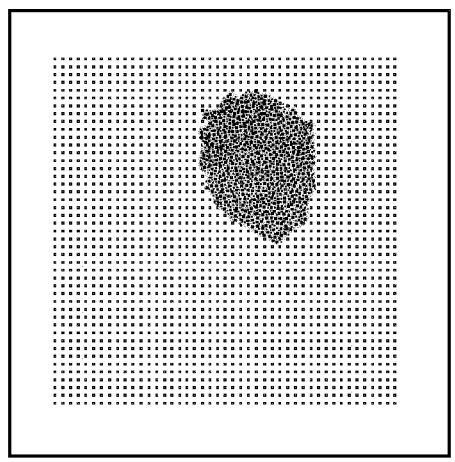

FIGS. 9A and 9B are contour-traced scanning electron microscope (SEM) images of a structured imprint layer before and after being press-contacted by a probing needle. The SEM images are true-to-scale. The lateral dimension of the square alignment pad contour is 45 μm. The alignment pad structure comprises an array of 45×45×=2025 pillars, with each pillar having a square lateral dimension of 500 nm and a free distance to the adjacent pillar of also 500 nm. As can be seen in FIG. 9B, the imprint of the needle is imaged by the structured imprint layer with high positional resolution. Imprint recognition and/or determination of the probing needle position can be carried out based on a defect density analysis across the alignment pad. Even the shape of the tip of the probing needle may be examined that way. It is to be noted that the recognition of the needle imprint shown in FIG. 9B and the determination of the imprint's position can be based on optical inspection (rather than on the SEM image as illustrated in FIG. 9B).

The alignment pad has a frame-like region formed by the main surface of the semiconductor substrate—similar as shown in FIG. 7. The alignment pad depicted in FIGS. 9A and 9B is formed in a BPSG/$SiO_x$ imprint layer 750 as shown in FIG. 8, and is located in the kerf region of a silicon wafer.

Figure 10:
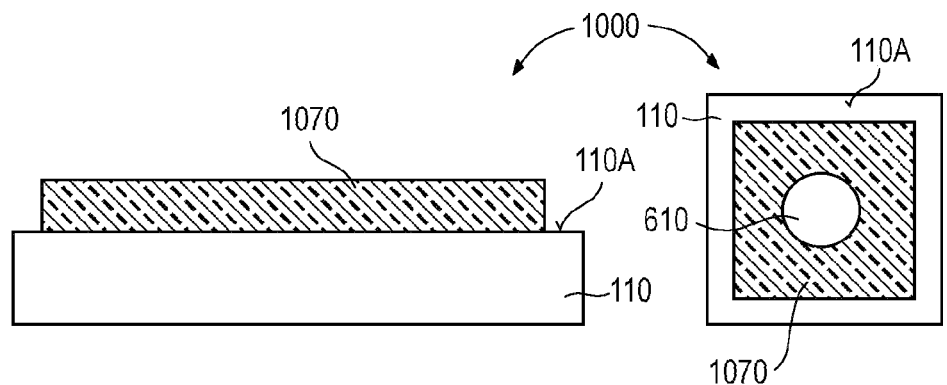
FIG. 10 is a schematic cross-sectional view and a schematic top view of an exemplary alignment pad including an unstructured imprint layer.

Another exemplary alignment pad 1000 is illustrated in FIG. 10. The alignment pad 1000 comprises an unstructured imprint layer 1070. As exemplarily shown in FIG. 10, the unstructured imprint layer 1070 may be contour-shaped. As to the effect and potential advantages of contour-shaping, reference is made to the description above.

The unstructured imprint layer 1070 may comprise or be of a polymer material, in particular a photoimide material or an epoxy-based material. According to other possibilities, the unstructured imprint layer 1070 may comprise or be of a low-k material or a metal material which, however, is different from the metal material of which the die pads of the ICs are formed.

Generally, if an unstructured imprint layer 1070 is used, the material of the unstructured imprint layer needs to have a hardness smaller than the hardness of the material of which the die pads of the ICs are formed in order to have the capability of generating a visible imprint 610 upon being press-contacted by a probing needle.

Figure 11:
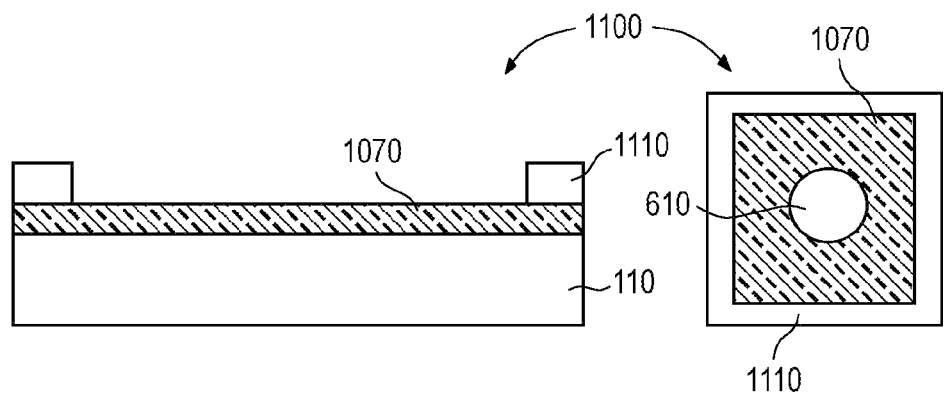
FIG. 11 is a schematic cross-sectional view and a schematic top view of an exemplary alignment pad including an unstructured imprint layer and a frame-shaped top layer.

A variant of the unstructured imprint layer 1070 is exemplified in FIG. 11. Here, the unstructured imprint layer 1070 may not be contour-shaped. It may, e.g., cover the entire substrate 110 or wafer surface. A frame-shaped layer 1110 is arranged over the unstructured imprint layer 1070. The frame-shaped layer 1110 may be applied, e.g., by lithography, printing, etc. The frame-shaped layer 1110 may be made of a material which provides for a high optical contrast against the material of the unstructured imprint layer 1070. That way, the frame-shaped layer 1110 defines a contour of the imprint layer 1070 which is easy to retrieve during optical inspection. This increases the detectability of the imprint 610 on the unstructured imprint layer 1070. For instance, the frame-shaped layer 1110 may be made of a hard material as mentioned for the structured imprint layer 750 and may be opened by etching in a defined area above the unstructured imprint layer 1070.

The concept of depositing a frame-shaped layer 1110 on an imprint layer which is not contour-shaped may also be applied to a structured imprint layer such as, e.g., imprint layer 750 of FIG. 8.

FIGS. 12 through 15 illustrate exemplary alignment pads 1200, 1300, 1400 and 1500, respectively, which each comprises a first imprint layer and a second imprint layer of different materials.

More specifically, alignment pad 1200 comprises a first imprint layer 1250 which is structured, and a second imprint layer 1290 which is continuous. The structured imprint layer 1250 may be identical with the structured imprint layer 750, and reference is made to the above description in order to avoid reiteration. The continuous imprint layer 1290 is a continuous imprint layer which is deposited over the structured imprint layer 1250. The continuous imprint layer 1290 (which could also be referred to as a structured imprint layer because it is structured in thickness by the underlying structured imprint layer 1250) may be made of a soft material such as any of the materials mentioned above for the unstructured imprint layer 1070. Further, the continuous imprint layer 1290 may be made of a material which provides for a high optical contrast relative to the material of the structured imprint layer 1250 and/or relative to the material of the main surface 110A of the semiconductor substrate 110. That way the addition of the continuous imprint layer 1290 may increase the visibility of the imprint 610 and/or the alignment pad 1200.

Figure 12:
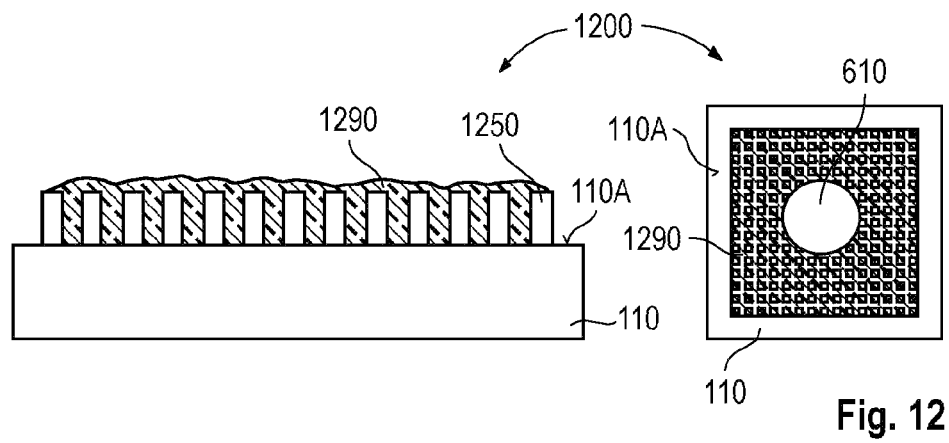
FIG. 12 is a schematic cross-sectional view and a schematic top view of an exemplary alignment pad including a structured first imprint layer and a continuous second imprint layer, wherein the alignment pad is framed by the exposed substrate.

For example, as illustrated in FIG. 12, the structured imprint layer 1250 and/or the continuous imprint layer 1290 may both be contour-shaped. In this case, the main surface 110A of the semiconductor substrate 110 may be visible as a frame of the alignment pad 1200.

Figure 13:
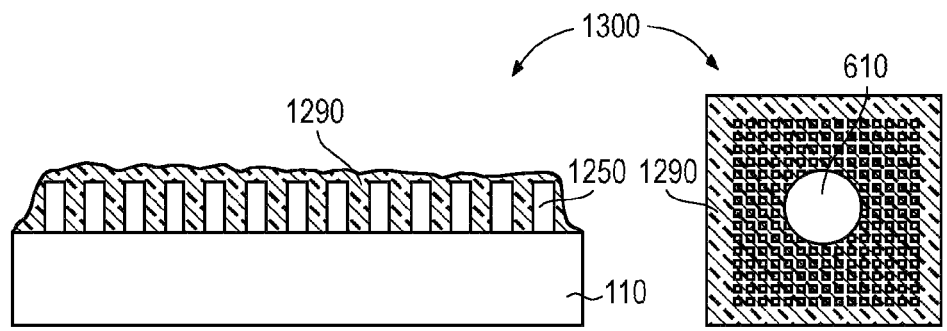
FIG. 13 is a schematic cross-sectional view and a schematic top view of an exemplary alignment pad including a structured first imprint layer and a continuous second imprint layer, wherein the alignment pad is framed by the continuous second imprint layer.

Referring to FIG. 13, the alignment pad 1300 may be identical to the alignment pad 1200 except that the continuous imprint layer 1290 is not contour-shaped. In this case, the alignment pad 1300 is framed by the material of the continuous imprint layer 1290 which may provide for a high optical contrast.

Figure 14:
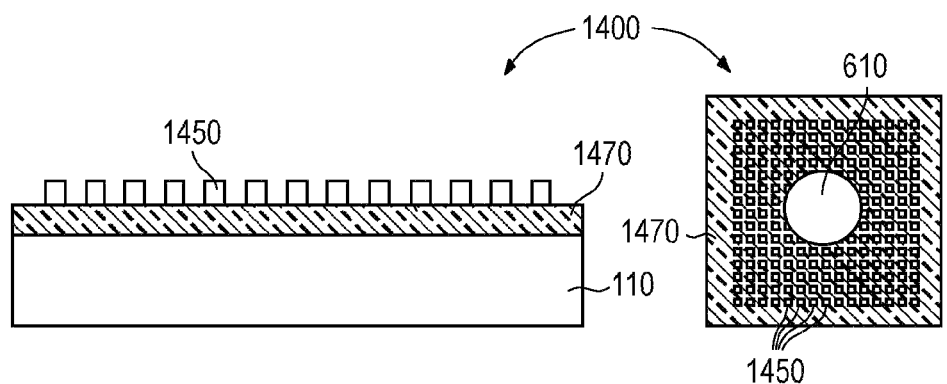
FIG. 14 is a schematic cross-sectional view and a schematic top view of an alignment pad including a structured first imprint layer and an unstructured second imprint layer, wherein the alignment pad is framed by the unstructured second imprint layer.

FIG. 14 illustrates a lower unstructured imprint layer 1470 and a structured imprint layer 1450 arranged over the unstructured imprint layer 1470. The structured imprint layer 1450 may be configured in accordance with the features described above for the structured imprint layer 750. The unstructured imprint layer 1470 may, e.g., be configured in accordance with the features described above for the unstructured imprint layer 1070.

As can be seen from FIG. 14, the unstructured imprint layer 1470 may not be contour-shaped and hence may provide an optical frame for alignment pad recognition. On the other hand, the structured imprint layer 1450 may be contour-shaped.

Generally, throughout the embodiments shown in FIGS. 7, 8, 9A, 9B, 12, 13 and 14, it is either possible that lithographic structuring of a layer to form the structured imprint layer partly or completely removes the layer except the pillars of the structured imprint layer (e.g. pillars 752 of FIG. 7) or that the layer of which the structured imprint layer is formed (e.g. the pre-existing substrate layer 112, see FIG. 1B) partly or completely remains in or on the semiconductor substrate 110 except the trenches which are removed from such layer to generate the structured imprint layer (see e.g. FIG. 8).

Figure 15:
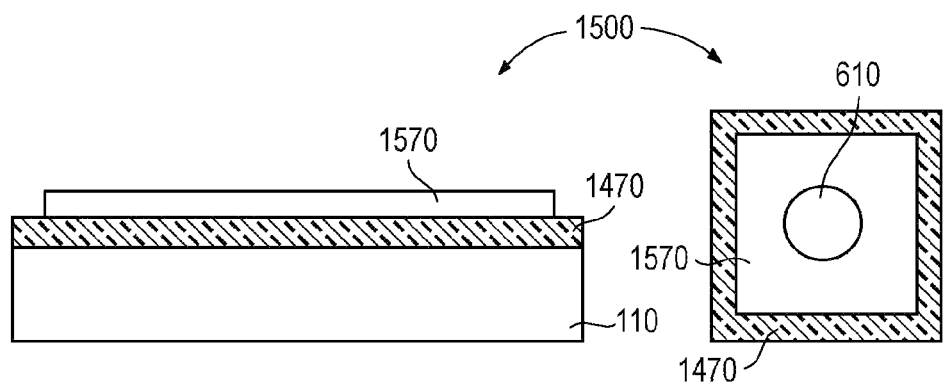
FIG. 15 is a schematic cross-sectional view and a schematic top view of an alignment pad including an unstructured first imprint layer and an unstructured second imprint layer, wherein the alignment pad is framed by the unstructured second imprint layer.

Referring to FIG. 15, an alignment pad 1500 may comprise a lower unstructured imprint layer 1470 (see also FIG. 14) and an upper unstructured imprint layer 1570. While the upper unstructured imprint layer 1570 may be contour-shaped, the lower unstructured imprint layer 1470 may laterally extend beyond the contour of the alignment pad 1500 and form the optical frame for alignment pad recognition.

In the example of the alignment pad 1500 at least one of the unstructured imprint layers 1470 and 1570 need to be formed from a "soft" material, e.g. one of the materials mentioned above with respect to the unstructured imprint layer 1070. The other (unstructured) imprint layer of FIG. 15 may be of a hard material such as, e.g. one of the materials mentioned for the structured imprint layer 750. If the upper unstructured imprint layer 1570 is, e.g., of a hard material (such as a material as aforementioned for the structured imprint layer 750), the upper unstructured imprint layer 1570 may be thin so as to collapse under the press-contacting movement of the probing needle.

All examples of alignment pads 1200, 1300, 1400, 1500 using at least two imprint layers may, e.g., be further equipped with a frame-shaped layer 1110 as exemplified in FIG. 11. Further, all examples of alignment pads 1100, 1200, 1300, 1400 and 1500 using at least two different layers may benefit from the choice of materials which provide for a high optical contrast relative to each other and/or relative to the substrate 110 in order to increase the visibility of the imprint 610 and/or the visibility of the contour of the alignment pad 1200, 1300, 1400, 1500.

Figure 16:
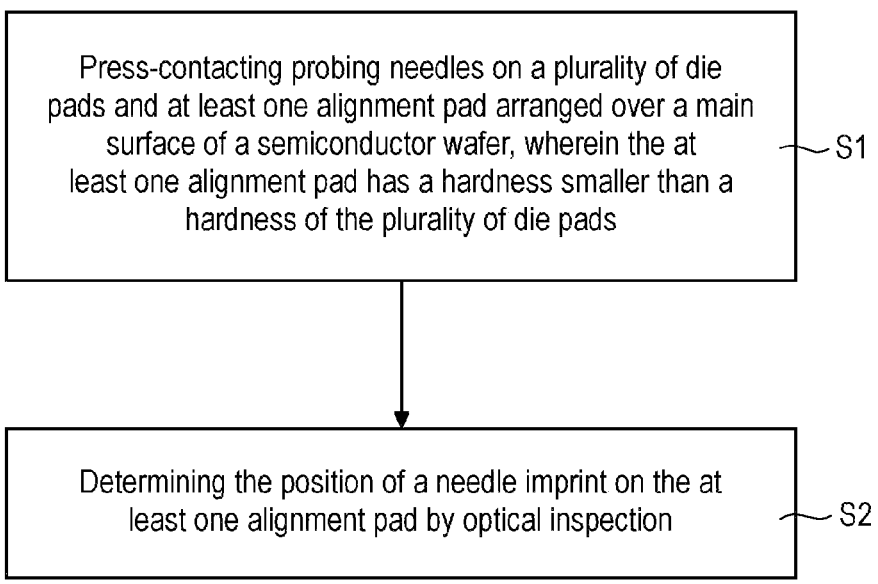
FIG. 16 is a flowchart depicting stages of a method of performing optical process control for semiconductor wafer probing.

FIG. 16 is a flowchart depicting stages of a method of performing optical process control for semiconductor wafer probing.

At S1 probing needles are press-contacted on a plurality of die pads and at least one alignment pad arranged over a main surface of a semiconductor wafer, wherein the at least one alignment pad has a hardness smaller than a hardness of the plurality of die pads. This process may be carried out by, e.g., the wafer test equipment 400 shown in FIGS. 4A, 4B and 5.

At S2 the position of a needle imprint on the at least one alignment pad is determined by optical inspection. This process may be carried out by, e.g., the optical inspection unit 500 as illustrated in FIG. 5.

The following examples pertain to further aspects of the disclosure:

Example 1 is a semiconductor substrate comprising a main surface over which a plurality of die pads and at least one alignment pad for optical process control for semiconductor wafer probing are arranged, wherein the alignment pad has a hardness smaller than a hardness of the plurality of die pads.

In Example 2, the subject matter of Example 1 can optionally include wherein the at least one alignment pad is configured to generate a visible imprint upon being press-contacted by a probing needle at semiconductor wafer probing.

In Example 3, the subject matter of Example 1 or 2 can optionally include wherein the plurality of die pads is configured to not generate a visible imprint or to generate only a hardly visible imprint upon being press-contacted by a probing needle at semiconductor wafer probing.

In Example 4, the subject matter of any preceding Example can optionally include wherein an indentation depth on the at least one alignment pad is equal to or greater than 50 nm.

In Example 5, the subject matter of any preceding Example can optionally include wherein an indentation depth on the plurality of die pads is less than 50 nm.

In Example 6, the subject matter of any preceding Example can optionally include wherein the at least one alignment pad comprises a structured imprint layer.

In Example 7, the subject matter of Example 6 can optionally include wherein the structured imprint layer comprises a regular patterned structure or a porous structure.

In Example 8, the subject matter of Example 6 or 7 can optionally include wherein the structured imprint layer comprises an inorganic insulating material, in particular a material based on silicon oxide or silicon nitride.

In Example 9, the subject matter Example 6 or 7 can optionally include wherein the structured imprint layer comprises a semiconductor material, in particular crystalline silicon, polysilicon, or amorphous silicon.

In Example 10, the subject matter of Example 6 or 7 can optionally include wherein the structured imprint layer comprises a first metal material.

In Example 11, the subject matter of one of Examples 6 to 10 can optionally include wherein a structure width of the structured imprint layer is equal to or greater than or less than 0.1 µm or 0.25 µm or 0.5 µm or 0.75 µm or 1.0 µm or 2.5 µm or 5.0 µm.

In Example 12, the subject matter of any preceding Example can optionally include wherein the at least one alignment pad comprises an unstructured imprint layer.

In Example 13, the subject matter of Example 12 can optionally include wherein the unstructured imprint layer comprises a polymer material, in particular a photo imide material or an epoxy-based material.

In Example 14, the subject matter of Example 12 can optionally include wherein the unstructured imprint layer comprises a second metal material or a low-k material.

In Example 15, the subject matter of any preceding Example can optionally include wherein the at least one alignment pad comprises a first imprint layer and a second imprint layer of different materials, wherein the first imprint layer is structured and the second imprint layer is continuous.

In Example 16, the subject matter of Example 15 can optionally include wherein the first imprint layer is disposed over the second imprint layer or the second imprint layer is disposed over the first imprint layer.

In Example 17, the subject matter of Example 15 or 16 can optionally include wherein the first imprint layer comprises a material selected from the group consisting of an inorganic insulating material, in particular a material based on silicon oxide or silicon nitride, a first metal material, and a semiconductor material, in particular crystalline silicon, polysilicon, or amorphous silicon.

In Example 18, the subject matter of any of Examples 15 to 17 can optionally include wherein the second imprint layer comprises a material selected from the group consisting of a polymer material, in particular a photo imide material or an epoxy-based material, a second metal material, and a low-k material.

In Example 19, the subject matter of any preceding Example can optionally include wherein the semiconductor substrate is the semiconductor wafer or is a semiconductor chip separated from the semiconductor wafer.

In Example 20, the subject matter of any of Examples 1 to 18 can optionally include wherein the semiconductor substrate is the semiconductor wafer and the at least one alignment pad is located in a dummy chip region or in a kerf region or in a process control monitor (PCM) block region on the semiconductor wafer.

In Example 21, the subject matter of any preceding Example can optionally include wherein the plurality of die pads comprises a layer of tungsten or tungsten alloy or titanium or titanium alloy or polysilicon.

Example 22 is a method of manufacturing a semiconductor device, including forming a plurality of die pads on a main surface of a semiconductor wafer; and forming at least one alignment pad for optical process control for semiconductor wafer probing on the main surface of the semiconductor wafer, the alignment pad having a hardness smaller than a hardness of the plurality of die pads.

In Example 23, the subject matter of Example 22 can optionally include wherein forming the at least one alignment pad comprises structuring an imprint layer of the at least one alignment pad by using lithography.

In Example 24, the subject matter of Example 23 can optionally include wherein the imprint layer of the at least one alignment pad is a portion of a wafer passivation layer covering the plurality of die pads, and structuring the imprint layer and forming openings for the plurality of die pads are performed by the same lithography.

In Example 25, the subject matter of any of Examples 22 to 24 can optionally include forming the at least one alignment pad comprises depositing an unstructured imprint layer of the at least one alignment pad.

In Example 26, the subject matter of any of Examples 22 to 25 can optionally include wherein the at least one alignment pad is formed in a dummy chip region or in a kerf region or in a process control monitor (PCM) block region on the semiconductor wafer.

Example 27 is a method of performing optical process control for semiconductor wafer probing, the method comprising press-contacting probing needles on a plurality of die pads and at least one alignment pad arranged over a main surface of a semiconductor wafer, wherein the at least one alignment pad has a hardness smaller than a hardness of the plurality of die pads; and determining the position of a needle imprint on the at least one alignment pad by optical inspection.

In Example 28, the subject matter of Example 27 can optionally include wherein the hardness of the at least one alignment pad is less than the hardness of the probing needles and/or the hardness of the plurality of die pads is equal to or greater than the hardness of the probing needles.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate comprising a main surface over which a plurality of die pads and at least one alignment pad for optical process control for semiconductor wafer probing are arranged, wherein the alignment pad has a hardness smaller than a hardness of the plurality of die pads.

2. The semiconductor device of claim 1, wherein the at least one alignment pad is configured to generate a visible imprint upon being press-contacted by a probing needle at semiconductor wafer probing.

3. The semiconductor device of claim 1, wherein the plurality of die pads is configured to not generate a visible imprint or to generate only a hardly visible imprint upon being press-contacted by a probing needle at semiconductor wafer probing.

4. The semiconductor device of claim 1, wherein an indentation depth on the at least one alignment pad is equal to or greater than 50 nm.

5. The semiconductor device of claim 1, wherein an indentation depth on the plurality of die pads is less than 50 nm.

6. The semiconductor device of claim 1, wherein the at least one alignment pad comprises a structured imprint layer.

7. The semiconductor device of claim 6, wherein the structured imprint layer comprises a regular patterned structure or a porous structure.

8. The semiconductor device of claim 6, wherein the structured imprint layer comprises an inorganic insulating material based on silicon oxide or silicon nitride.

9. The semiconductor device of claim 6, wherein the structured imprint layer comprises crystalline silicon, polysilicon, or amorphous silicon.

10. The semiconductor device of claim 6, wherein the structured imprint layer comprises a first metal material.

11. The semiconductor device of claim 6, wherein a structure width of the structured imprint layer is equal to or greater than or less than 0.1 µm or 0.25 µm or 0.5 µm or 0.75 µm or 1.0 µm or 2.5 µm or 5.0 µm.

12. The semiconductor device of claim 1, wherein the at least one alignment pad comprises an unstructured imprint layer.

13. The semiconductor device of claim 12, wherein the unstructured imprint layer comprises a photo imide material or an epoxy-based material.

14. The semiconductor device of claim 12, wherein the unstructured imprint layer comprises a second metal material or a low-k material.

15. The semiconductor device of claim 1, wherein the at least one alignment pad comprises a first imprint layer and a second imprint layer of different materials, and wherein the first imprint layer is structured and the second imprint layer is continuous.

16. The semiconductor device of claim 15, wherein the first imprint layer is disposed over the second imprint layer or the second imprint layer is disposed over the first imprint layer.

17. The semiconductor device of claim 15, wherein the first imprint layer comprises a material selected from the group consisting of an inorganic insulating material based on silicon oxide or silicon nitride, a first metal material, crystalline silicon, polysilicon, and amorphous silicon.

18. The semiconductor device of claim 15, wherein the second imprint layer comprises a material selected from the group consisting of a photo imide material, an epoxy-based material, a second metal material, and a low-k material.

19. The semiconductor device of claim 1, wherein the semiconductor substrate is the semiconductor wafer or is a semiconductor chip separated from the semiconductor wafer.

20. The semiconductor device of claim 1, wherein the semiconductor substrate is the semiconductor wafer and the at least one alignment pad is located in a dummy chip region or in a kerf region or in a process control monitor (PCM) block region on the semiconductor wafer.

21. The semiconductor device of claim 1, wherein the plurality of die pads comprises a layer of tungsten or tungsten alloy or titanium or titanium alloy or polysilicon.

22. A method of manufacturing a semiconductor device, the method comprising:
   forming a plurality of die pads over a main surface of a semiconductor wafer; and
   forming at least one alignment pad for optical process control for semiconductor wafer probing over the main surface of the semiconductor wafer, the alignment pad having a hardness smaller than a hardness of the plurality of die pads.

23. The method of claim 22, wherein forming the at least one alignment pad comprises structuring an imprint layer of the at least one alignment pad by using lithography.

24. The method of claim 23, wherein the imprint layer of the at least one alignment pad is a portion of a wafer passivation layer covering the plurality of die pads, and wherein structuring the imprint layer and forming openings for the plurality of die pads are performed by the same lithography.

25. The method of claim 22, wherein forming the at least one alignment pad comprises depositing an unstructured imprint layer of the at least one alignment pad.

26. The method of claim 22, wherein the at least one alignment pad is formed in a dummy chip region or in a kerf region or in a process control monitor (PCM) block region on the semiconductor wafer.

27. A method of performing optical process control for semiconductor wafer probing, the method comprising:
   press-contacting probing needles on a plurality of die pads and at least one alignment pad arranged over a main surface of a semiconductor wafer, wherein the at least one alignment pad has a hardness smaller than a hardness of the plurality of die pads; and
   determining a position of a needle imprint on the at least one alignment pad by optical inspection.

28. The method of claim 27, wherein the hardness of the at least one alignment pad is less than the hardness of the probing needles and/or the hardness of the plurality of die pads is equal to or greater than the hardness of the probing needles.

* * * * *